July 15, 1958 W. G. PFANN 2,842,831

MANUFACTURE OF SEMICONDUCTOR DEVICES

Filed Aug. 30, 1956 2 Sheets-Sheet 1

INVENTOR
W. G. PFANN
BY
George S. Indig
ATTORNEY

MANUFACTURE OF SEMICONDUCTOR DEVICES

Filed Aug. 30, 1956 2 Sheets-Sheet 2

INVENTOR
W. G. PFANN
BY George S. Indig
ATTORNEY

United States Patent Office 2,842,831

Patented July 15, 1958

2,842,831

MANUFACTURE OF SEMICONDUCTOR DEVICES

William G. Pfann, Far Hills, N. J., assignor to Bell Telephone Laboratories, Incorporated, New York, N. Y., a corporation of New York Application August 30, 1956, Serial No. 607,084

3 Claims. (Cl. 29—25.3)

This invention relates to methods of fabricating semiconductive translating devices and more particularly to methods for providing precisely positioned, closely spaced electrode contacts to such devices.

In general, close spacing of two or more electrode connections is required in transistors and semiconductor diodes. In transistors, for example, reducing the distance between emitter and base, or collector and base connections reduces series resistances in the body of the device. High series resistance may lead to electrical instability through the mechanism of positive feedback. In diodes, close spacing reduces the ohmic series resistance and thereby improves rectification and power handling characteristics.

Methods for constructing semiconductor translating devices such as transistors by diffusion techniques in materials such as germanium and silicon are now receiving close scrutiny by workers in the field. Advantages gained by the use of such diffusion techniques include the possibility of producing uniform large area p-n junctions suitable for use in high power devices and at the same time very thin surface layers desirable in high frequency devices. As more becomes known about the diffusion properties of significant impurities in extrinsic semiconductive materials, it is recognized that the ease of manufacture of a variety of devices having a broad range of electrical properties makes it likely that diffusion devices will find increased use in a broad range of applications. For example, the recognition by C. S. Fuller that the rate of diffusion of some group III acceptors is many times greater than that of some group V donors in silicon has made possible the perfection of a two-junction device produced by simultaneous double diffusion of an acceptor and a donor into silicon. See Bell System Technical Journal, volume 35, January 1956, page 1 et seq.

In order to fully realize the potentialities of devices produced by diffusion techniques, it is generally desirable to produce very closely and accurately spaced electrode contacts. Spacings for such contacts are typically of the order of 0.5 to 1 mil distant or less. In accordance with present technology in which electrode contact is frequently made by evaporating or otherwise depositing electrode material on the surface of the device, use is made of very accurately constructed masking jigs. Disadvantages in the use of such jigs having spacing members of the order of mils or less are readily apparent, such devices by their nature being expensive and fragile.

In accordance with this invention resort to such masking jigs and other conventional masking means is avoided. Where it is desired to place two or more electrode contacts in close proximity while maintaining very close tolerance, this invention makes use of a first electrode member having overhanging sides which serves both as a permanent part of the final structure and a mask for shadowing the surface of the semiconductive material immediately under the overhanging portion. Material is sprayed or otherwise deposited from a point or line source upon adjacent portions of the surface of the semiconductive material to form a second electrode and/or conductivity region. The first electrode contact which may, for example, be spherical in shape, may serve the simple function of merely making electrical contact to an existing region, or may be composed of, plated with, or otherwise contain a significant impurity or impurities which, upon heating, will form alloy junctions with the semiconductive material. Compositions and various processing parameters requisite for the production of such alloy junctions are well known to those skilled in the semiconductor art.

The invention will be more easily understood by reference to the accompanying drawings in which.

Figure 1A:
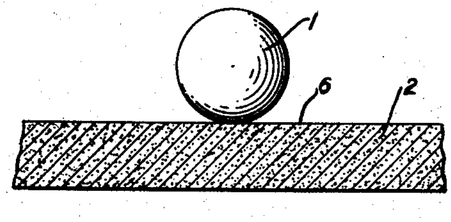
Figs. 1A, 1B and 1C are schematic elevational views in section illustrating three stages in the construction of a device in accordance with one species of the process of this invention.
Figure 1B:
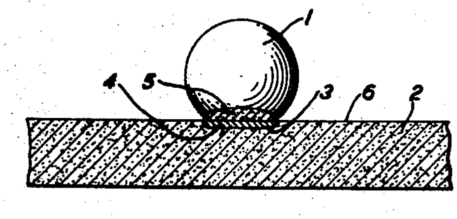

Referring again to Figs. 1A, 1B and 1C which are presented to illustrate steps in the preparation of a typical electrode pair, a sphere or cylinder 1 which is composed of, has plated upon, or otherwise contains a significant impurity of the conductivity type and having the other requisite characteristics necessary to produce an alloy bond, is placed upon a body 2 of a semiconductive material such as silicon, germanium or a balanced alloy containing one element each from groups III and V of the periodic table according to Mendelyeev. Where such materials are contained chiefly on the surface of sphere or cylinder 1, the body of structure 1 may desirably be composed of a material having a thermal expansivity similar to that of the semiconductive material. In the instance of germanium molybdenum is satisfactory. Suitable bonding materials which may be contained on the surface of sphere 1 include aluminum, indium, lead-indium and gold-4 percent gallium for producing p-type connection on an n-type body 2 and gold-1 percent antimony, lead-2 percent arsenic, and copper-2 percent phosphorus for producing an n-type connection on a p-type body 2. A typical diameter for a sphere 1 to be used as an electrode contact may be of the order of from 1 to 10 mils. Depending on the composition of the surface of sphere 1 and the material of which semiconductive body 2 is composed, the entire assembly is heated to a temperature, for example, of the order of from 400° C. to 700° C. usually in an inert atmosphere such as hydrogen or nitrogen for a time sufficient to alloy the material of semiconductive body 2 with the surface composition of sphere 1 to produce conductivity region 3, thereby resulting in p-n junction 4. As a usual adjunct to the production of conductivity region 3, doped conductive region 5 also is produced. Such a region 5 is produced where the conditions and materials are such as to result in the formation of a eutectic alloy. The timing and temperature are chosen to restrict the conductivity region 3 to less than the diameter of sphere 1 where feasible, although a larger conductivity region resulting from any surface diffusion may be reduced in size through etching by CP4 (50 parts concentrated $HNO_3$, 30 parts HF, 30 parts glacial acetic acid, 1 part bromine) for several seconds or by other methods known to the art.

Figure 1C:
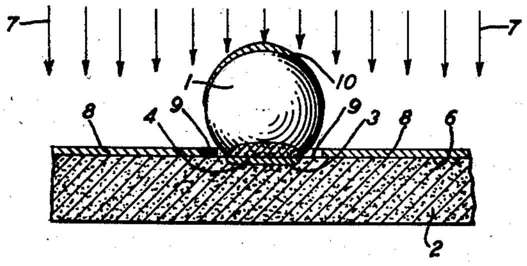

After having formed the alloy junction 4 a second electrode material is evaporated or otherwise deposited on surface 6 of body 2 from a point or line source above sphere 1. In Fig. 1C the direction of such material is depicted by means of parallel arrows 7. It is seen from this figure that sphere 1 shadows body 2 so that although a deposited layer 8 forms on surface 6 of body 2, shadowed region 9 of surface 6 remains uncoated. Deposited region 10 which forms on the upper surface of sphere 1 is unobjectionable.

The evaporated or otherwise deposited layer 8 producing second electrode contact may, for example, be gold, silver, tin, lead, rhodium, nickel, or alloys of these metals with group III or group V elements such as gold antimony, choice of material being governed by the conductivity type of body 2. Once the device is at the stage depicted in Fig. 1C, it may be desirable to heat the entire assembly once again to a temperature sufficient to form a eutectic alloy between layer 8 and body 2 at surface 6. If this is done the alloying material contained on the surface of sphere 1 and the material of layer 8 should generally be such that the eutectic alloy formed between sphere 1 and body 2 has a higher melting temperature than that of the eutectic formed between layer 8 and body 2. Electrical contact may then be made to sphere 1 and layer 8 by conventional means as, for example, by soldering, by use of spring contacts or, in the instance of layer 8, by first bonding a wire to the semiconductive material followed by evaporating a metal over the bonded region.

Figure 2:
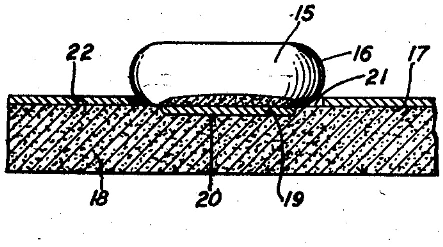
Fig. 2 is a front elevation view in section of a section of a device constructed in accordance with this invention.

Fig. 2 depicts a device in the stage shown in Fig. 1C and makes use of a piece of wire 15 having rounded ends 16 which is placed on surface 17 of semiconductive body 18 and is then alloyed to body 18 at surface 17 so as to form alloy region 19 and p-n junction 20. Wire 15 is then used as an integral mask to shadow region 21 while layer 22 is deposited on surface 17.

Figure 3:
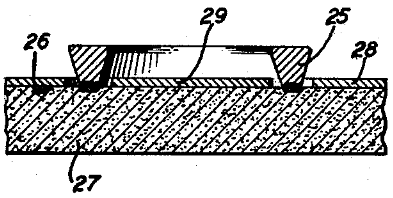
Fig. 3 is a sectional view of a device constructed in accordance with another species.

In Fig. 3 the masking electrode contact 25 is in the form of a ring having the overhanging cross-section shown. Depositing a second electrode material from a source above ring 25 onto surface 26 of semiconductor body 27 in a direction essentially perpendicular to surface 26 results in two isolated layers, those denoted 28 and 29. Use of electrode configuration 25 may result in a single surface n-p-n configuration.

Figure 4:
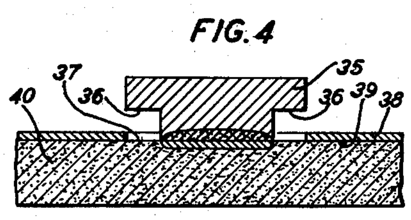
Fig. 4 is a front elevation view in section of a portion of a device constructed in accordance with yet another species.

In Fig. 4, first electrode contact is made by means of an undercut T-shaped mask 35 which, due to overhanging portion 36 shadows region 37 while permitting deposition of layer 38 on surface 39 of semiconductive body 40.

Figure 5:
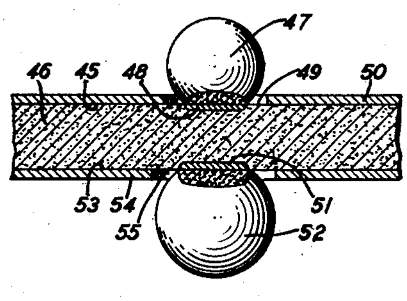
Fig. 5 is a front elevation view in section of a portion of a device containing two pairs of closely spaced electrodes made by a process herein.

Fig. 5 is illustrative of a shadowing method of producing two closely spaced electrode pairs. In the manner described in connection with Figs. 1A, 1B and 1C, closely spaced electrode contacts are made on surface 45 of semiconductive body 46 by first alloying sphere 47 and body 46 to produce p-n junction 48 and using sphere 47 to shadow region 49 while depositing layer 50 as shown. In the same manner p-n junction 51 is formed by alloying sphere 52 to surface 53 and layer 54 is evaporated or otherwise deposited on layer 53 from a source position such as to result in masked portion 55.

Figure 6:
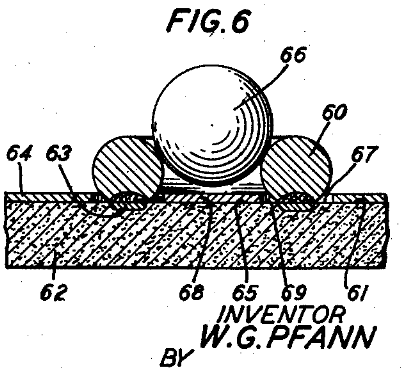
Fig. 6 is a sectional view of a portion of a device, the construction of which utilizes an integral masking method in combination with an external masking method as described herein.

Fig. 6 is illustrative of a method of producing a single surface semiconductor device having two conductivity regions closely spaced with and separated by a ring-shape electrode. The device is constructed by placing ring 60 on surface 61 of semiconductive body 62, and alloying ring 60 to surface 61 to produce junction 63. Layer 64 is evaporated or otherwise deposited on surface 61 while shielding surface region 65 enclosed by ring 60 by the positioning of sphere 66 as shown. The overhanging portion of ring 60 results in the shadowing of surface region 67 during the formation of layer 64. After layer 64 has been deposited, sphere 66 is removed and layer 68 is deposited over a circular area concentric with ring 60 as shown. The inner surface of ring 60 shields portion 69 of surface 61 so as to prevent shorting between ring 60 and layer 68. To avoid the necessity of shielding the portion of the uppermost surface of body 62 surrounding ring 60 during the deposition of layer 68, it is necessary only to select a layer 68 material such that on deposition over layer 64 it either does not penetrate the material of layer 64 or combines with it to produce the desirable conductivity type and characteristics in layer 64 or in the semiconductor region underneath.

Figure 7A:
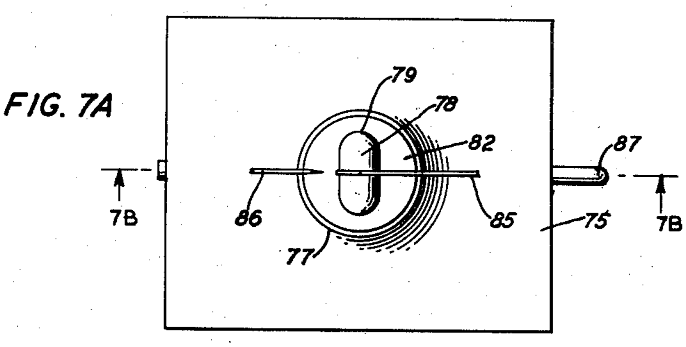
Figs. 7A and 7B are plan and elevation views of a diffused base transistor having electrode contacts made in accordance with these processes.
Figure 7B:
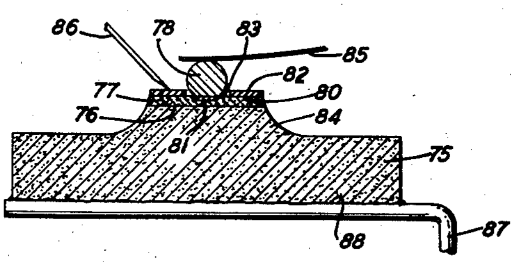

Figs. 7A and 7B depict a diffused base transistor of the general type described and claimed in copending application Serial No. 496,202, filed March 23, 1955. The use of spacing jigs and other masking means are avoided between the emitter and base electrodes by use of the shadowing technique of this invention. An outline of the processing steps in the manufacture of such a device is presented herein as Example 1. The device shown is comprised of semiconductive body 75 which may, for example, be p-type germanium. P–N junction 76 is produced between p-type region 75 and n-type layer 77 which may be created, for example, by vapor phase diffusion by the heating of body 75 in the presence of a pellet of arsenic doped germanium in an oven. Wire 78 having rounded portions 79 is placed on surface 80 as shown and is heated to form alloy junction 81. Suitable materials of which wire 78 may be composed or plated where region 77 is n-type, include aluminum, indium, lead-1 percent indium, and gold-4 percent gallium. From a point or line source above wire 78, gold-antimony or other suitable material such as an alloy of gold, silver or tin with a group V element, is deposited on surface 80 to produce layer 82 and shadowed region 83. The device is completed by heating to the eutectic temperature of the semiconductive material of body 75 and a material of layer 82 at surface 80 followed by etching away part of body 75 to surface 84 so as to minimize the area of p-n junction 76 and thereby reduce the capacitance of the device. Emitter and base contacts are made respectively to wire 78 and layer 82 by means of pressure members 85 and 86. Collector contact is made to the underside of body 75 by means of platinum tab 87 which is secured to body 75 at surface 88 by use, for example of indium solder.

Figure 8A:
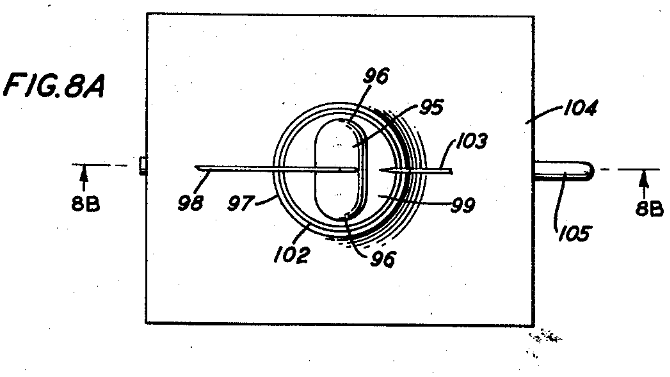
Figs. 8A and 8B are plan and elevation views of a double diffused transistor having closely spaced electrode contacts as described.
Figure 8B:
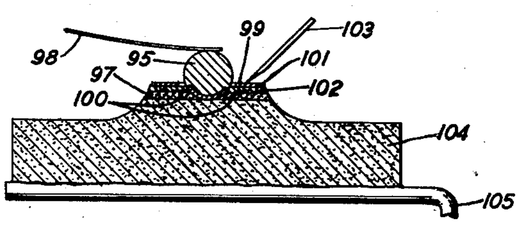

Figs. 8A and 8B depict a double diffusion transistor of the type described in copending United States application Serial No. 516,674, filed June 20, 1955. Emitter and base electrodes are produced in accordance with this invention.

The transistor shown consists of wire 95 having rounded ends 96 making non-rectifying contact with the diffused p-layer 97. As in the construction of the device of Fig. 7A, wire 95 may, for example, be composed of aluminum or contain a coating of this material. Wire 95 acts as base electrode and is connected to its associated circuit through contact spring 98. Deposited layer 99 which may be a gold-antimony alloy and which is deposited from a source above wire 95 so as to result in shaded portion 100 on surface 101, makes emitter contact to n-type diffused region 102. Circuit connection to emitter electrode 99 is made by means of contact spring 103. Diffused regions 102, which is n-type in this example, and 97, which is p-type, are made in n-type semiconductive material 104 which may, for example, be silicon by a double diffusion method in accordance with which significant impurities of group III and group V of the periodic table are simultaneously diffused into the semiconductive body 104 by a method described in the above-cited application 516,674. Collector electrode 105 may be soldered to the underside of body 104 with a gold-antimony solder where body 104 is composed of n-type silicon. Base electrode 95 performs a somewhat different function from that of electrode 78 of Figs. 7A and 7B in that it merely makes ohmic rather than rectifying contact to layer 97. Conditions under which such a bond may be produced with p-type region 97 without shorting out n-type region 102 will be apparent from Example 2 which presents an outline of the specific processing steps utilized in producing such a device. The specific examples relating to the manufacture of the devices of Figs. 7A and 7B and 8A and 8B are given below.

*Example 1*

A diffused base p-n-p transistor is constructed in accordance with this invention as follows: The starting material is p-type germanium of a resistivity of 0.8 ohm-centimeter. A single crystal portion having the dimensions 200 x 60 x 15 mils is cut, lapped and polished. The block is then etched in CP–4, which is a mixture of 50 parts concentrated $HNO_3$, 30 parts 40 percent HF, 30 parts glacial acetic acid, 1 part bromine by volume, for a period of about 15 seconds and is then washed in deionized water and placed in a vacuum oven together with about 1 gram of germanium containing of the order $10^{18}$ atoms arsenic per cc. of Ge. The vacuum oven is a small molybdenum capsule heated by radiation from a tungsten coil and surrounded by radiation shields made of molybdenum. Before inserting the germanium block and the germanium arsenic pellet, the capsule is baked out at about 1900° C., to remove impurities detrimental to the electrical characteristics of germanium. See Physical Review, volume 96, page 46, 1954. The oven is then brought up to a temperature of approximately 840° C. in a period of about 11 minutes and is maintained at that temperature for about 15 minutes while maintaining the pressure in the oven at about $10\times10^{-5}$ millimeters of mercury. Under these conditions, the vapor pressure of arsenic is about $10^{-4}$ millimeter of mercury. The germanium block is then removed from the furnace and the thickness and conductivity of the diffused layer and measured by a four-point probe method. Under the conditions outlined above, the sheet resistivity is about 200 ohms per square and the layer has a thickness of about $1.5\times10^{-4}$ centimeter.

An emitter electrode resembling electrode 78 of the device of Figs. 7A and 7B is produced by first etching the upper surface of the diffused layer and contacting with a 3 mil diameter aluminum wire of a length of about 8 mils and heating the assembly on a heating strip for about 0.5 second to a temperature of about 700° C. The entire heating and cooling cycle including momentary attainment of the upper value takes about 1 second. Under these conditions an alloy region such as region 81 of the device of Fig. 7B is formed. This alloy region does not project as far as the vertical projection of the extreme dimension of the wire on a plane parallel with the surface of the germanium body nor does it penetrate the diffused end layer. From a line source parallel with and at a distance of about five inches above the wire, a film of gold-one-tenth percent antimony alloy of a thickness of about 3000 angstroms is evaporated onto the upper surface of the diffused layer. The shadowing effect of the wire results in a shaded and, therefore, uncoated surface region of about 1 mil in width surrounding the entire contacting region of the wire with the surface. The assembly is again placed on a heater strip and heated to about 356° C. which is the gold-germanium eutectic temperature. Using indium solder, a tab such as platinum tab 87 in the device of Fig. 7B is secured to the underside of the germanium block, thereby making electric contact. Solder contact is made directly through the diffused n-type layer, the indium in the solder being sufficient to compensate for the n-type impurity, thereby making non-rectifying contact to the p-type block. Finally, the wire electrode and the surrounding evaporated layer of a width of about 10 mils is masked with a dot of wax and the entire unit is etched in CP–4 so as to reduce the area of the collector junction and thereby reduce the capacitance of the device. Spring contact is made to the wire emitter electrode and deposited layer base electrode by use of electrically pointed 1-mil Phosphor bronze wire.

A transistor so constructed has an alpha of about 0.98 and an alpha-cutoff frequency of several hundred megacycles per second.

*Example 2*

This example relates to the construction of a double diffusion transistor utilizing the shadowing technique of this invention for making emitter and base contact. Specific information relating to materials and processing parameters for use in the construction of a double diffusion transistor may be obtained from copending application Serial No. 516,674, filed June 20, 1955.

A block of single crystal silicon of a resistivity of 4 ohm-centimeter and of dimensions 100 mils square and 10 mils thick is prepared for diffusion by lapping a square surface with No. 600 silicon carbide paper, etching in a mixture of nitric and hydrofluoric acids and rinsing thoroughly with distilled water. The silicon block is next heated in a clean evacuated quartz oven in the presence of antimony oxide for one and a quarter hours at 1250° C. This results in a thin first diffusion layer of n-type conductivity of a resistivity lower than 4 ohm-centimeter. Following the first diffusion step the silicon block is heated again in a clean evacuated quartz oven in the presence of aluminum antimonide for about 20 minutes at a temperature of 1250° C. Because of the higher diffusivity and lower solubility of aluminum there results at the end of the second diffusion step a silicon block having two distinct conductivity layers, the outer of which is antimony-rich n-type and the inner of which is aluminum-rich p-type such as layers 102 and 97, respectively, of Fig. 8B. The thickness of these layers is of the order of from 0.1 to 0.2 mil each. The maximum concentration of antimony in the outer diffusion layer is less than about $10^{19}$ atoms per cubic centimeter. If base contact is to be made in the manner herein described, it is important that this concentration not be exceeded.

A piece of aluminum wire having rounded ends and about 3 mils in diameter and 6 mils in length is next placed in contact with the surface of the outer diffused layer. Such a wire resembles wire 95 of Figs. 8A and 8B. The assembly is then heated in a vacuum furnace for about 2 seconds at a temperature of about 850° C. to insure melting and formation of the aluminum-silicon eutectic material which melts at 577° C. This results in penetration through the surface n-type layer into the second layer of p-type conductivity. Alloying of such a wire contact to the second diffused layer is shown in Fig. 8B. It is not necessary to control the diffusion conditions so closely as to prevent penetration of the aluminum into the bulk portion of the silicon body. It is, however, necessary that heating continue for a sufficiently long period to insure alloying to p-type region.

The emitter electrode such as layer 99 of the device of Fig. 8B is then formed by evaporating a layer of gold-1 percent antimony onto the surface with which the wire is alloyed from a point or line source over the wire electrode so as to produce a shadowed and, therefore, uncoated region between the gold-antimony layer and the aluminum wire. In this example, the resultant spacing is of the order of 0.5 mil. After forming a layer about 4000 angstroms in thickness, the assembly is heated to a temperature of about 400° C. to insure formation of a gold-silicon eutectic material between the deposited layer and the n-type diffused region. Alternately, formation of the gold-silicon autectic may be produced by passing a current through a tungsten wire point plated with gold-antimony which point would then serve as electrical contact to the emitter electrode.

The entire assembly is then soldered to a platinum tab using gold-antimony solder. A circular area about 8 mils in diameter and including the wire electrode and the deposited gold-antimony layer is masked with wax and the entire device is etched with a mixture of nitric and hydrofluoric acids to produce the configuration shown in Figs. 8A and 8B.

Electrical contact is made to the wire base and surface emitter electrodes by means of Phosphor bronze contact springs. A device so constructed has an alpha of about 0.97 and an alpha-cutoff frequency of about 120 megacycles per second.

It is to be understood that whereas the invention has been described in terms including specific examples relating to a diffused base germanium transistor and a double diffused silicon transistor, the invention is broadly directed to precision methods for making closely-spaced electrode contact to semiconductive devices. These methods are applicable to the manufacture of a wide range of devices some of which have been described in the literature and some of which have yet to be developed. The principles of this invention may readily be extended to application to devices made of other semiconductive materials and of other configurations by use of information available to all persons skilled in the semiconductor art in accordance with the teachings set forth herein.

It is to be recognized that whereas the invention has been discussed chiefly in terms of forming a masked region by alloying by means of melting above the eutectic temperature of the semiconductive material and a component of the contacting portion of the masking structure, other methods of producing regions of altered electrical characteristics may be substituted. Such methods include formation of lowest melting non-eutectic alloys of these components and altering of electrical characteristics in defined regions by solid state diffusion. As noted, the outlined methods may be used for formation of masked low resistance electrical contacts to the semiconductive body.

What is claimed is:

1. A method of making closely spaced electrode contact to a body of semiconductor material comprising making a first electrode contact by placing on the said body a conducting material of such configuration that its cross-sectional area on a plane substantially parallel to, but not coincident with, the plane of juncture of the said first electrode and the said body is greater than that of the area of the said body contacted by the said first electrode, heating the area of juncture to at least the eutectic temperature of the semiconductor material of the body and an element contained in the said conducting material, and depositing a second electrode material on the surface of the said body to which first electrode contact is made from a source of such configuration and position that the junction of the first electrode and the body is concealed from the source by the first electrode, thereby resulting in an undeposited surface region surrounding the entire region common to the first electrode and the body.

2. A method of making closely spaced electrode contact to a body of semiconductor material comprising making a first electrode contact by attaching to the said body a conducting material of such configuration that its cross-sectional area on a plane substantially parallel to, but not coincident with, the plane of juncture of the said first electrode and the said body is greater than that of the area of the said body contacted by the said first electrode, depositing a second electrode material on the surface of the said body to which first electrode contact is made from a source of such configuration and position that the junction of the first electrode and the body is concealed from the source by the first electrode, thereby resulting in an undeposited surface region surrounding the entire region common to the first electrode and the body, and heating the area common to the second electrode material and the said body to at least the eutectic temperature of the semiconductor material of the body and an element contained in the second electrode material.

3. The method of claim 1 in which aluminum is contained on the surface of the first electrode material at a point in contact with the said body, in which the semiconductor material is of n-type conductivity silicon followed by a p-type conductivity layer and an n-type conductivity layer successively in the direction of first electrode contact at the surface of contact and in which the area of contact of the body and the first electrode material is heated to a temperature sufficient to alloy the said aluminum and silicon, and for a sufficient time interval to cause the alloy region so formed to penetrate the outer n-type conductivity layer.

References Cited in the file of this patent

UNITED STATES PATENTS 2,450,020 Richards et al. ---------- Sept. 28, 1948